(12) United States Patent
Varma et al.

(10) Patent No.: US 9,003,111 B2
(45) Date of Patent: *Apr. 7, 2015

(54) METHODS AND APPARATUS PROVIDING HIGH-SPEED CONTENT ADDRESSABLE MEMORY (CAM) SEARCH-INVALIDATES

(71) Applicant: QUALCOMM Incorporated, San Diego, CA (US)

(72) Inventors: Manju Rathna Varma, San Diego, CA (US); David Paul Hoff, Cary, NC (US); Jason Philip Martzloff, Holly Springs, NC (US)

(73) Assignee: QUALCOMM Incorporated, San Diego, CA (US)

( * ) Notice: Subject to any disclaimer, the term of this patent is extended or adjusted under 35 U.S.C. 154(b) by 33 days.

This patent is subject to a terminal disclaimer.

(21) Appl. No.: 13/969,636

(22) Filed: Aug. 19, 2013

(65) Prior Publication Data

US 2013/0339597 A1    Dec. 19, 2013

Related U.S. Application Data

(63) Continuation of application No. 13/269,701, filed on Oct. 10, 2011, now Pat. No. 8,572,313.

(51) Int. Cl.
  *G06F 12/00* (2006.01)
  *G11C 15/00* (2006.01)
  *G11C 15/04* (2006.01)

(52) U.S. Cl.
  CPC ............. *G06F 12/00* (2013.01); *G11C 15/04* (2013.01)

(58) Field of Classification Search
  USPC ................. 711/108, 163; 365/49.1, 49.17
  See application file for complete search history.

(56) References Cited

U.S. PATENT DOCUMENTS

| | | |
|---|---|---|
| 6,707,693 B1 | 3/2004 | Ichiriu |
| 6,874,058 B1 | 3/2005 | Turvey |
| 7,085,147 B2 | 8/2006 | Murakami et al. |
| 7,224,594 B2 | 5/2007 | Behrends et al. |
| 7,546,420 B1 | 6/2009 | Shar et al. |
| 2008/0140924 A1 | 6/2008 | Lee et al. |
| 2012/0147642 A1 | 6/2012 | Gronlund et al. |
| 2013/0091325 A1 | 4/2013 | Varma et al. |

OTHER PUBLICATIONS

International Search Report and Written Opinion—PCT/US2012/059613—ISA/EPO—Feb. 6, 2013.

*Primary Examiner* — John Lane
(74) *Attorney, Agent, or Firm* — Joseph B. Agusta (57) ABSTRACT

Embodiments of a Content Addressable Memory (CAM) enabling high-speed search and invalidate operations and methods of operation thereof are disclosed. In one embodiment, the CAM includes a CAM cell array including a number of CAM cells and a valid bit cell configured to generate a match indicator, and blocking circuitry configured to block an output of the valid bit cell from altering the match indicator during an invalidate process of a search and invalidate operation. Preferably, the output of the valid bit cell is blocked from affecting the match indicator for the CAM cell array beginning at a start of the invalidate process and continuing until an end of the search and invalidate operation.

23 Claims, 8 Drawing Sheets

METHODS AND APPARATUS PROVIDING HIGH-SPEED CONTENT ADDRESSABLE MEMORY (CAM) SEARCH-INVALIDATES

PRIORITY CLAIM

The present application is a continuation patent application of and claims priority to U.S. patent application Ser. No. 13/269,701 filed Oct. 10, 2011, titled "METHODS AND APPARATUS PROVIDING HIGH-SPEED CONTENT ADDRESSABLE MEMORY (CAM) SEARCH-INVALIDATES," which is incorporated herein by reference in its entirety.

FIELD OF THE DISCLOSURE

The technology of the disclosure generally relates to Content Addressable Memory (CAM) and more specifically to methods and apparatuses for high-speed search and invalidate operations for CAM.

BACKGROUND

Figure 1:
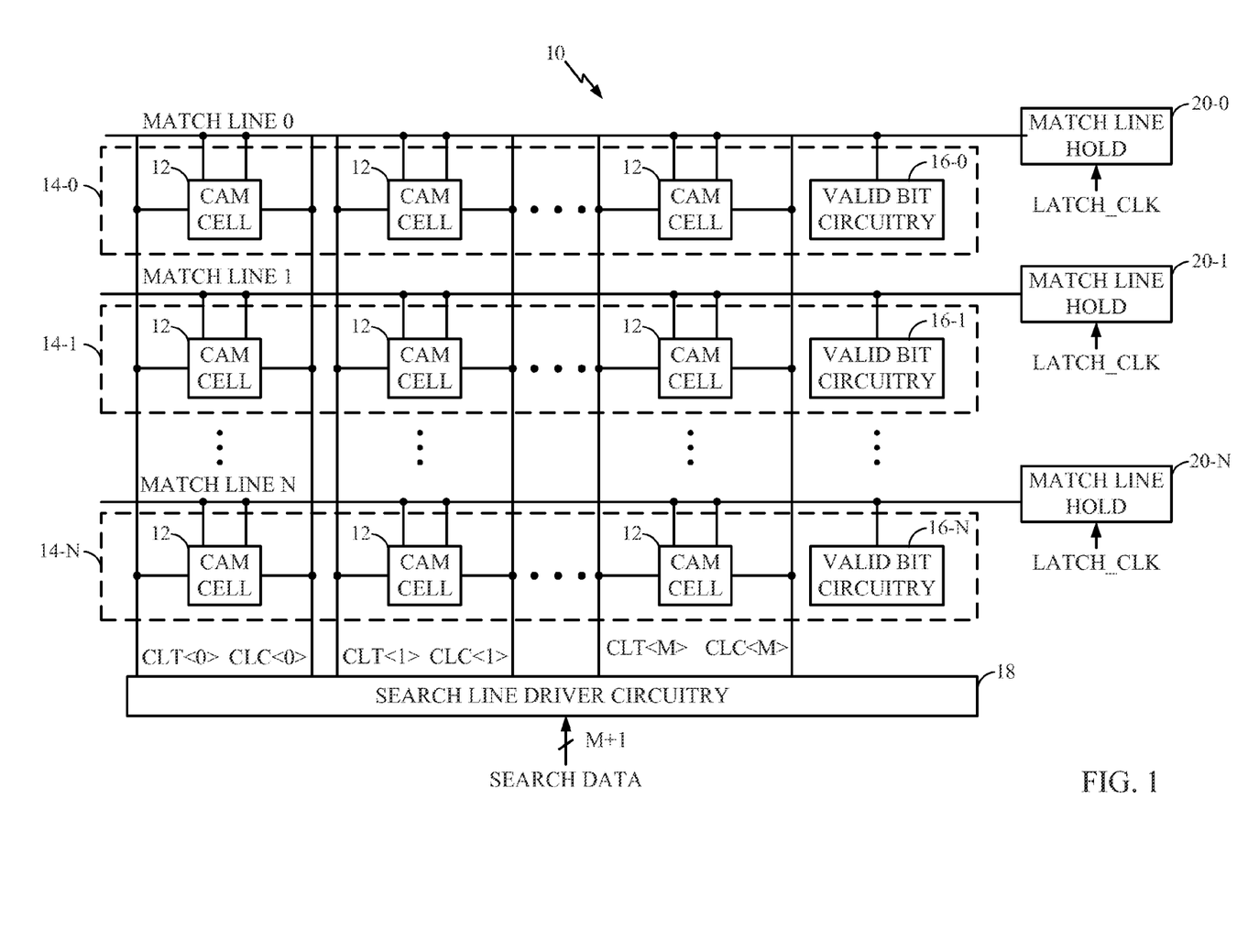
FIG. 1 is a block diagram of a conventional Content Addressable Memory (CAM)

Content Addressable Memory (CAM) is a type of memory that enables high-speed parallel searching of the memory for a desired data word. As such, CAMs may be used in search-intensive applications. FIG. 1 illustrates a conventional CAM 10. The CAM 10 includes a number of CAM cells 12 arranged into a number of CAM cell arrays 14-0 through 14-N, which are generally referred to herein collectively as CAM cell arrays 14 and individually as CAM cell array 14. Each of the CAM cells 12 is conventionally composed of a semiconductor memory cell (e.g., a Static Random Access Memory (SRAM) cell) and comparison circuitry. The CAM cell arrays 14-0 through 14-N store corresponding digital words having M+1 bits. In addition, the CAM cell arrays 14-0 through 14-N include corresponding valid bit circuitry 16-0 through 16-N, which are generally referred to herein collectively and individually as valid bit circuitry 16. For each CAM cell array 14, the corresponding valid bit circuitry 16 stores a bit value that represents a validity of the CAM cell array 14. The CAM 10 enables parallel searching of the CAM cell arrays 14-0 through 14-N for a desired digital word, i.e., search data, in a single clock cycle.

More specifically, in order to search the CAM 10, the search data is input into search line driver circuitry 18, which in turn outputs true and complementary logic values (CLT<0> through CLT<M> and CLC<0> through CLC<M>, respectively) onto corresponding search lines. For the search, in a low clock phase, match lines (MATCH LINE 0 through MATCH LINE N) connected to the CAM cell arrays 14-0 through 14-N, respectively, are precharged to a high voltage level (i.e., a logic "1"). Then, during a high clock phase, comparison circuitry of the CAM cells 12 compares the logic values on the corresponding search lines with corresponding data bits stored by the CAM cells 12. In this particular embodiment, the CAM cells 12 whose stored bit values do not match the logic values on the corresponding search lines operate to discharge the corresponding match lines to a low voltage level (i.e., a logic "0"). Thus, for example, if one of the CAM cells 12 in the CAM cell array 14-0 stores a "0" and the corresponding bit of the search data is a "1," then that CAM cell 12 will pull MATCH LINE 0 low, thereby indicating that the digital word stored by that CAM cell array 14-0 does not match the search data. In addition, if the digital word stored by any of the CAM cell arrays 14 is invalid, the valid bit circuitry 16 for that CAM cell array 14 operates to pull the corresponding match line low. Thus, at the end of the high clock phase, only the match line(s) for the CAM cell array(s) 14 that stores a valid digital word that matches the search data remains high. Upon assertion of a latch clock (LATCH_CLK), the match lines (MATCH LINE 0 through MATCH LINE N) are latched by corresponding match line hold circuitry 20-0 through 20-N, which are generally referred to herein collectively and individually as match line hold circuitry 20.

One importation operation for CAMs such as the CAM 10 is referred to as a search and invalidate (search-invalidate) operation. In a search-invalidate operation, the CAM 10 is searched for the CAM cell array 14 (or possibly multiple CAM cell arrays 14) that stores a digital word that matches desired search data, and then that CAM cell array 14 is invalidated. Both the search and the invalidation are performed in a single clock cycle.

Figure 2A:
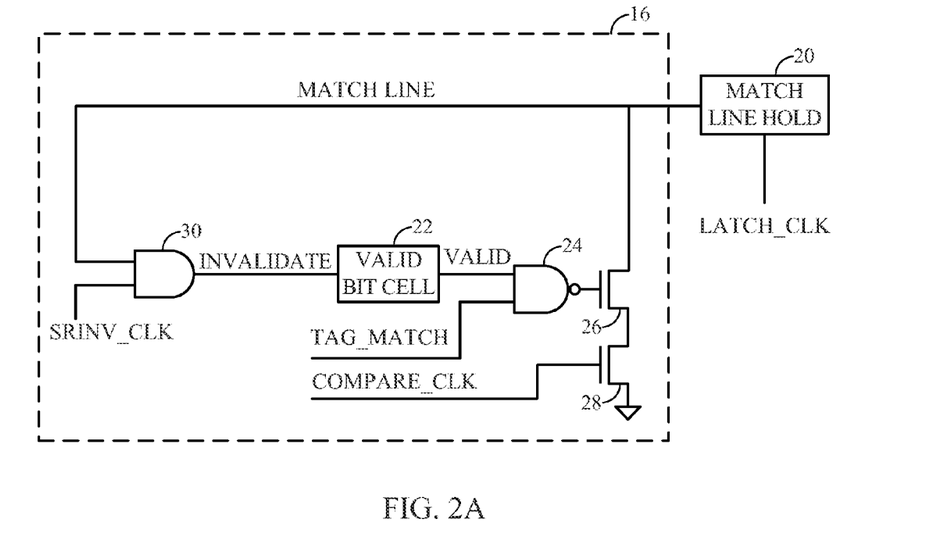
FIG. 2A is a block diagram of conventional valid bit circuitry.
Figure 2B:
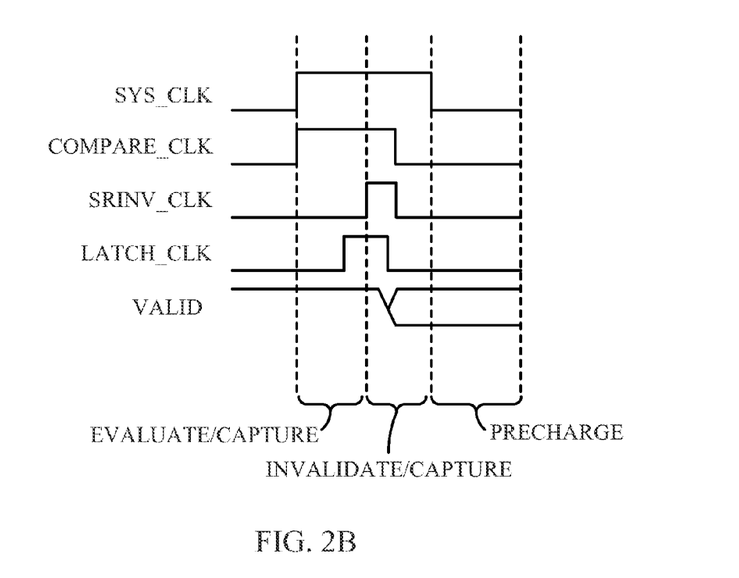
FIG. 2B is a timing diagram illustrating a number of self-timed clock signals that control the valid bit circuitry of FIG. 2A during a search and invalidate operation.

FIGS. 2A and 2B are a more detailed illustration of the conventional valid bit circuitry 16 and a corresponding timing diagram. For a search-invalidate operation, at a rising edge of a system clock (SYS_CLK), a comparison clock (COMPARE_CLK) is asserted to trigger the start of a compare process. During the compare process, if a valid bit cell 22 stores a valid bit, which in this case is a "1," the valid bit cell 22 outputs a "1" to a NAND gate 24, which in turn outputs a "0" if both the output of the valid bit cell 22 and a TAG_MATCH input are "1." The TAG_MATCH input is asserted to "1" when a digital word stored by the CAM cells 12 in the corresponding CAM cell may 14 matches the search data. As a result of the NAND gate 24 providing a "0" at its output, transistor 26 is disabled such that the corresponding match line is not discharged. Alternatively, if the valid bit cell 22 stores an invalid bit, which in this case is a "0," the valid bit cell 22 outputs a "0" to the NAND gate 24, which in turn outputs a "1" to the transistor 26. At that point, the transistor 26 is activated by the "1" from the NAND gate 24, and transistor 28 is activated by the comparison clock. As a result, the match line is discharged.

Sometime after the rising edge of the system clock, a search-invalidate clock (SRINV_CLK) is asserted to trigger the start of an invalidate process. Preferably, by the time the search-invalidate clock is asserted, the comparison has completed, and a latch clock (LATCH_CLK) has already been asserted to latch the match line into the corresponding match line hold circuitry 20. During the invalidate process, an AND gate 30 compares the search-invalidate clock and the corresponding match line. Assuming that the match line is high at the end of the compare process, when the search-invalidate clock is asserted, the AND gate 30 outputs a logic "1," which results in writing of an invalid bit value (e.g., a "0") to the valid bit cell 22, thereby invalidating the CAM cell array 14. In contrast, if the match line is low at the end of the compare process, when the search-invalidate clock is asserted, the AND gate 30 outputs a logic "0" such that the invalid bit is not written to the valid bit cell 22, and the corresponding CAM cell array 14 remains valid.

Two parameters which govern the search-invalidate process are: (1) the invalidate process must not disturb a match indicator (i.e., hit) for the CAM cell array(s) 14 that stores a valid digital word that matches the search data and (2) the invalidate process must be given sufficient time to write the valid bit cell 22 of the CAM cell array(s) 14 to be invalidated. These two parameters are becoming increasingly difficult to meet and will soon be impracticable if not impossible to meet using the conventional valid bit circuitry 16 due to the continued scaling of CAMs to 28 nanometer (nm) processing technologies and beyond. More specifically, increased physical variations as a result of scaling may result in the invalidate process completing before the comparison has completed and the match line is latched by the match line hold circuitry 20. As a result, the invalidate process will disturb the match indicator for the corresponding CAM cell array 14 by pulling the corresponding match line low before it is latched by the match line hold circuitry 20. In addition, the increased physical variations may require an increase in the duration of the search-invalidate process (i.e., the SRINV_CLK) in order to ensure that the valid bit cell 22 is written. However, increasing the duration of the search-invalidate process means that there is less time available for the compare process to complete, which may result in CAM cell arrays 14 being erroneously validated or CAM cell arrays 14 that should be invalidated not being invalidated.

Therefore there is a need for a CAM, and more specifically valid bit circuitry for a CAM, that addresses the aforementioned issues.

SUMMARY OF THE DISCLOSURE

Embodiments of a Content Addressable Memory (CAM) enabling high-speed search and invalidate operations and methods of operation thereof are disclosed. In one embodiment, the CAM includes a CAM cell array including a number of CAM cells and a valid bit cell configured to generate a match indicator, and blocking circuitry configured to block an output of the valid bit cell from altering the match indicator during an invalidate process of a search and invalidate operation. Preferably, the output of the valid bit cell is blocked from affecting the match indicator for the CAM cell array beginning at a start of the invalidate process and continuing until an end of the search and invalidate operation.

In another embodiment, the CAM includes a CAM cell array including a number of CAM cells and valid bit circuitry, where the valid bit circuitry performs an invalidate process for a search and invalidate operation in response to a phase-based clock signal. More specifically, the search and invalidate operation is performed during a single pulse of a system clock signal, and the invalidate process is performed during a pulse of a search-invalidate clock signal that is delayed from a rising edge of the pulse of the system clock signal by a predefined amount of time. The pulse of the search-invalidate clock signal continues until a falling edge of the pulse of the system clock signal. During the pulse of the search-invalidate clock signal, the valid bit circuitry determines whether a compare process of the search and invalidate operation resulted in a match, or hit, for the CAM cell array and, if there is a match, writes an invalid bit to a valid bit cell of the valid bit circuitry. As a result of the phase-based search-invalidate clock signal, an amount of time that the valid bit circuitry has to write the valid bit cell is maximized.

DETAILED DESCRIPTION

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments of a Content Addressable Memory (CAM) enabling high-speed search and invalidate operations and methods of operation thereof are disclosed. In one embodiment, the CAM includes a CAM cell array including a number of CAM cells and a valid bit cell configured to generate a match indicator, and blocking circuitry configured to block an output of the valid bit cell from altering the match indicator during an invalidate process of a search and invalidate operation. Preferably, the output of the valid bit cell is blocked from affecting the match indicator for the CAM cell array beginning at a start of the invalidate process and continuing until an end of the search and invalidate operation.

Figure 3:
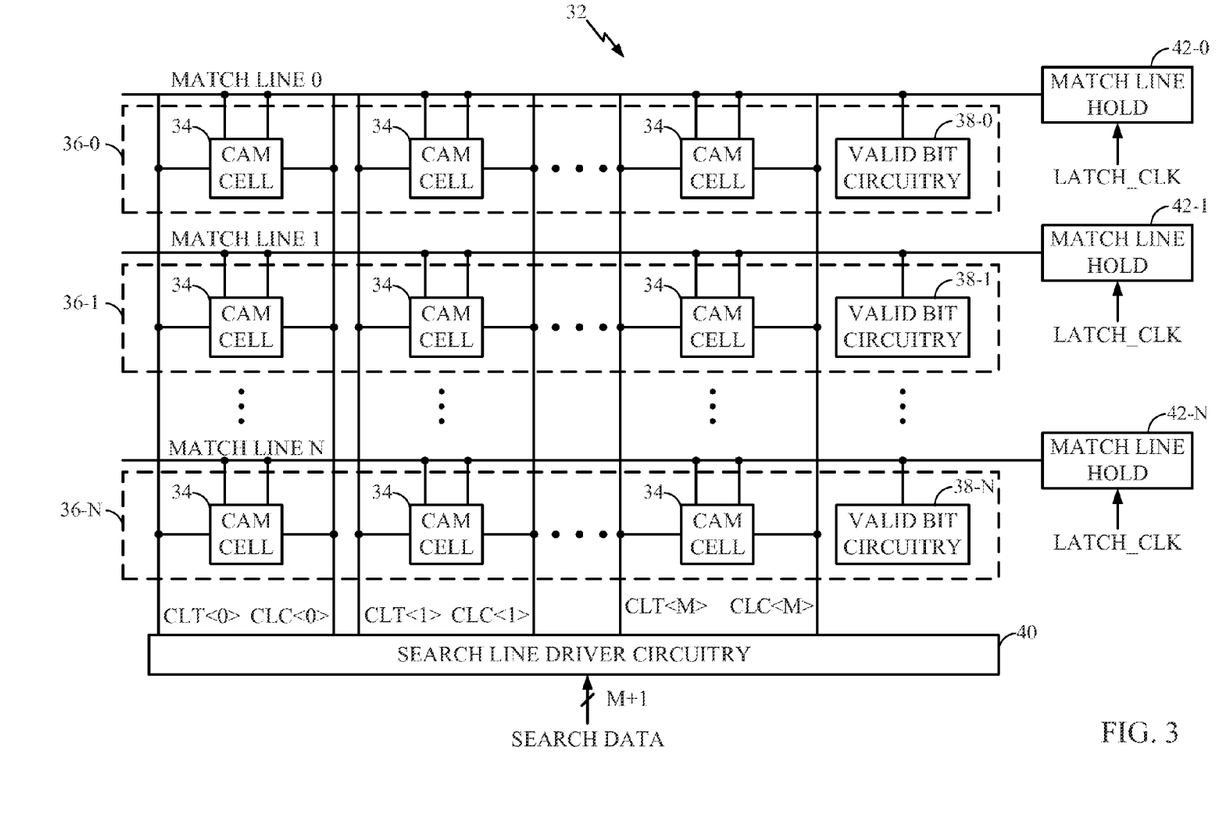
FIG. 3 is a block diagram of a CAM according to one embodiment of the present disclosure.

In this regard, FIG. 3 illustrates a Content Addressable Memory (CAM) 32 according to one embodiment of the present disclosure. As illustrated, the CAM 32 includes CAM cells 34 arranged into a number of CAM cell arrays 36-0 through 36-N, which are generally referred to herein collectively as CAM cell arrays 36 and individually as CAM cell array 36. Notably, while the CAM cell arrays 36 of FIG. 3 are rows of CAM cells 34 in a two-dimensional arrangement, the term "CAM cell array" as used herein is not limited thereto. The CAM cell arrays 36 may be any configuration of CAM cells 34 used to store a digital word, where the number of bits in the digital word may be, for example, 8, 16, 32, 64, 128, or the like. Further, the CAM cell arrays 36 may include, for example, CAM cells 34 in a single level integrated circuit or may include CAM cells 34 on multiple levels of a multi-level integrated circuit.

Each of the CAM cell arrays 36-0 through 36-N includes a number (M+1) of CAM cells 34 that store an M+1 bit digital word. In addition, the CAM cell arrays 36-0 through 36-N include corresponding valid bit circuitry 38-0 through 38-N, which are generally referred to herein both collectively and individually as valid bit circuitry 38. As discussed below, the valid bit circuitry 38-0 through 38-N include corresponding valid bit cells that store valid bits representing the validity of the digital words stored by the CAM cells 34 in the CAM cell arrays 36-0 through 36-N, respectively.

The CAM cell arrays 36-0 through 36-N are connected to corresponding match lines (MATCH LINE 0 through MATCH LINE N) and search line driver circuitry 40. A search operation is performed by pre-charging the match lines (MATCH LINE 0 through MATCH LINE N) to a high voltage (e.g., $V_{DD}$) and inputting desired search data (i.e., an input digital word) into the search line driver circuitry 40. In response, the search line driver circuitry 40 drives search lines CLT<0> through CLT<M> and CLC<0> through CLC<M> to states that correspond to the bits of the desired search data. For example, CLT<0> is driven to a value equal to the $0^{th}$ bit of the search data, CLC<0> is driven to a complement of the $0^{th}$ bit of the search data, etc.

Then, during the search operation, comparison circuitry within the CAM cells 34 compares the bits stored by the CAM cells 34 and the corresponding bits of the search data. For each CAM cell array 36, if the digital word stored by the CAM cells 34 in the CAM cell array 36 matches the search data and the digital word stored by the CAM cells 34 in the CAM cell array 36 is valid as indicated by the valid bit stored within the valid bit circuitry 38 in the CAM cell array 36, then the match line connected to the CAM cell array 36 is not discharged (i.e., remains high). In contrast, if the digital word stored by the CAM cells 34 in the CAM cell array 36 does not match the search data or if the digital word stored by the CAM cells 34 in the CAM cell array 36 is invalid, the CAM cell array 36 discharges the associated match line. More specifically, any CAM cell 34 in the CAM cell array 36 that stores a bit that does not match the corresponding bit of the search data operates to discharge the associated match line to a low voltage level (e.g., $V_{SS}$ or ground). Similarly, if the bit stored by the valid bit cell of the valid bit circuitry 38 is representative of an invalid state (e.g., a "0"), then the valid bit circuitry 38 discharges the connected match line to a low voltage level. At the end of the search operation, a latch clock (LATCH_CLK) is asserted such that the match lines (MATCH LINE 0 through MATCH LINE N) are latched by corresponding match line hold circuitry 42-0 through 42-N, which are generally referred to herein collectively and individually as match line hold circuitry 42.

For a search and invalidate (search-invalidate) operation, a search is performed to identify the CAM cell array(s) 36 storing a digital word that matches the search data, and the valid bit circuitry 38 for the identified CAM cell array(s) 36 write the corresponding valid bit cell(s) to the invalid state (i.e., logic "0"). The search and invalidate processes for the search-invalidate operation are both performed within a single clock cycle. More specifically, as discussed below in detail, in order to perform a search-invalidate operation, a compare process is first performed. At the end of the compare process, the match line of the CAM cell array 36 storing a valid digital word that matches the search data remains at the high logic level, which is referred to herein as a match indicator or hit rather than a miss. Then, during the same clock cycle, each valid bit circuitry 38 examines the match line of the corresponding CAM cell array 36 and writes the corresponding valid bit cell to the invalid state if the match line indicates a match, or hit. This is referred to as an invalidate process of the search-invalidate operation. Notably, while the discussion herein focuses on the scenario where there is one matching CAM cell array 36, there may be more than one matching CAM cell array 36 that is identified and invalidated during the search-invalidate operation.

Figure 4A:
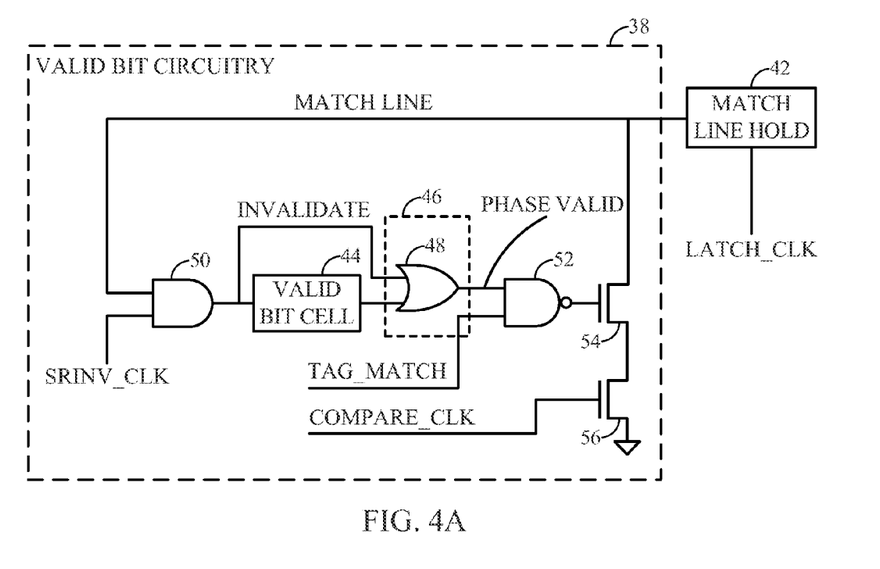
FIG. 4A is a block diagram of valid bit circuitry that blocks an output of a valid bit cell during an invalidate process of a search and invalidate operation according to one embodiment of the present disclosure.

FIG. 4A is a block diagram of the valid bit circuitry 38 for one of the CAM cell arrays 36 of FIG. 3 according to one embodiment of the present disclosure. Notably, this discussion is equally applicable to the valid bit circuitry 38 of the other CAM cell arrays 36. As shown, the valid bit circuitry 38 includes a valid bit cell 44. In addition, unlike the conventional valid bit circuitry 16 of FIG. 2A, the valid bit circuitry 38 includes blocking circuitry 46 that operates to block an output of the valid bit cell 44 from affecting a match indicator, or hit, on the match line during the invalidate process of the search-invalidate operation. In this particular embodiment, the blocking circuitry 46 includes an OR gate 48. However, as will be appreciated by one of ordinary skill in the art, the blocking circuitry 46 may be implemented in numerous ways and is not limited to the OR gate 48. By blocking the output of the valid bit cell 44 from affecting a match indicator on the match line during the invalidate process, the blocking circuitry 46 ensures that the match indicator on the match line is not disturbed when writing the valid bit cell 44 to the invalid state during the invalidate process.

The valid bit circuitry 38 further includes an AND gate 50 having a first input coupled to the match line and a second input that receives a search-invalidate clock (SRINV_CLK). An output of the AND gate 50 is connected to the valid bit cell 44 and operates to provide a signal, which is referred to herein as an invalidate signal. When the search-invalidate clock is asserted high and the match line is at a high logic level, the AND gate 50 asserts the invalidate signal high such that the valid bit cell 44 is written to the invalid state (e.g., a "0" is written to the valid bit cell 44). The OR gate 48 has a first input coupled to the output of the AND gate 50 to receive the invalidate signal and a second input coupled to an output of the valid bit cell 44. In this embodiment, the output of the valid bit cell 44 corresponds to the bit stored by the valid bit cell 44. In other words, the output of the valid bit cell 44 is high if the valid bit cell 44 stores a logic "1" and low if the valid bit cell 44 stores a logic "0." When the invalidate signal is asserted high, an output of the OR gate 48 is high regardless of the output of the valid bit cell 44. In this manner, the OR gate 48 blocks the output of the valid bit cell 44 from affecting a match indicator on the match line when the invalidate signal is asserted. As discussed below, the invalidate signal is asserted during the invalidate process if the match line is high as a result of a match during the comparison phase of the search-invalidate operation.

In this particular embodiment, the output of the OR gate 48 is connected to an input of a NAND gate 52, and the other input of the NAND gate 52 receives a TAG_MATCH signal. The TAG_MATCH input is asserted to "1" when a digital word stored by the CAM cells 34 in the corresponding CAM cell array 36 matches the search data. Note that the TAG_MATCH signal is optional. In another embodiment, there may be no TAG_MATCH signal, in which case the NAND gate 52 is replaced with a NOT gate. An output of the NAND gate 52 is low when both the output of the OR gate 48 and the TAG_MATCH signal are high. Otherwise, the output of the NAND gate 52 is high. A gate of transistor 54 is connected to the output of the NAND gate 52 such that the transistor 54 is on when the output of the NAND gate 52 is high and off when the output of the NAND gate 52 is low. Transistor 56 is connected in series with the transistor 54 and is controlled by a comparison clock (COMPARE_CLK).

Figure 4B:
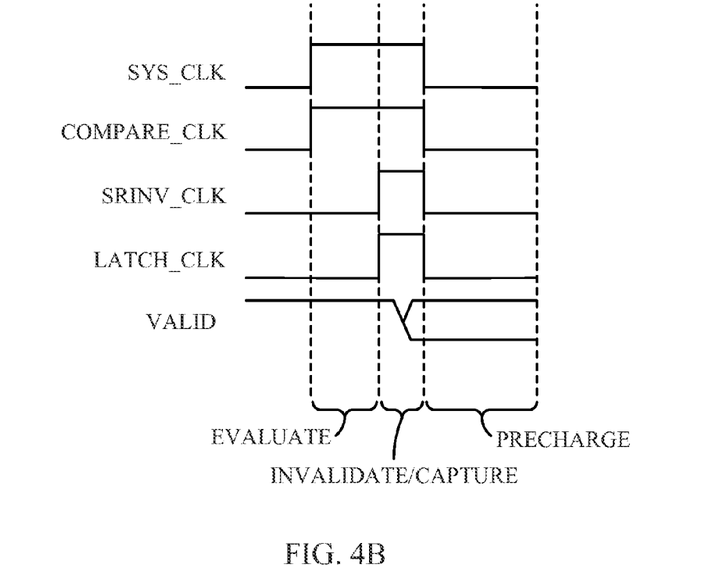
FIG. 4B is a timing diagram illustrating phase-based clock signals that control the operation of the valid bit circuitry of FIG. 4A during a search and invalidate operation according to one embodiment of the present disclosure.

FIG. 4B is a timing diagram illustrating the various clock signals used to control the valid bit circuitry 38 and the match line hold circuitry 42 during a search-invalidate operation according to one embodiment of the present disclosure. In this embodiment, the comparison clock (COMPARE_CLK), the search-invalidate clock (SRINV_CLK), and the latch clock (LATCH_CLK) are phase-based clock signals. As used herein, a phase-based clock signal is a clock signal that is asserted at a starting edge of an active phase of a system clock (SYS_CLK) or asserted after a defined amount of time has elapsed after the starting edge of the active phase of the system clock and remains asserted until an ending edge of the active phase of the system clock. In many of the embodiments described herein, the active phase of the system clock (SYS_CLK) is the high phase of the system clock (SYS_CLOCK) such that the starting edge of the active phase is the rising edge of the system clock (SYS_CLK) and the ending edge is the falling edge of the system clock (SYS_CLK). However, the present disclosure is not limited thereto. For instance, the active phase of the system clock (SYS_CLK) may alternatively be the low phase of the system clock (SYS_CLK) such that the starting edge is the falling edge and the ending edge is the rising edge. Still further, while a phase-based clock signal as used herein is preferably limited to a single active phase of the system clock (SYS_CLK), a phase-based clock signal may alternatively span multiple active phases of the system clock (SYS_CLK). As a result using phase-based clock signals, a duration of each of the clock pulses for the comparison clock, the search-invalidate clock, and the latch clock can be increased or decreased by adjusting a frequency, or more specifically a pulse width, of the system clock.

The phase-based clock signals are beneficial for many reasons. For example, if, due to variations in the manufacturing process, the valid bit cell 44 is unable to be written in the amount of time allocated for the invalidate process for a particular system clock frequency, the frequency of the system clock may be decreased to provide additional time for writing the valid bit cell 44. Note that while the comparison clock, the search-invalidate clock, and the latch clock are preferably phase-based clock signals, the present disclosure is not limited thereto. One or more and potentially all of the comparison clock, the search-invalidate clock, and the latch clock may alternatively be self-timed clock signals. As used herein, a self-timed clock signal is a clock signal that is asserted at a starting edge of an active phase of the system clock or that occurs after a defined amount of time has elapsed after the starting edge of the active phase of the system clock and deasserted after a defined amount of time has elapsed since being asserted.

In operation, in order to perform a search-invalidate operation, the match line is first pre-charged during the low-phase of the system-clock. Then, at the rising edge of the system clock, the comparison clock is asserted. Once the comparison clock is asserted, comparison of the digital words stored by the CAM cell arrays 36 begins. After a defined amount of time has elapsed since the rising edge of the system clock, the search-invalidate clock is asserted. The amount of time between the rising edge of the system clock and the rising edge of the search-invalidate clock is designed to include sufficient margin to allow comparison to complete before the start of the invalidate process, taking into account manufacturing variations. Assuming that a match has occurred for the CAM cell array 36 (i.e., the match line is high), once the search-invalidate clock is asserted, the AND gate 50 asserts the invalidate signal high. As a result, the blocking circuitry 46 blocks the output of the valid bit cell 44 from affecting the match indicator on the match line while the valid bit cell 44 is written to the invalid state. More specifically, by asserting the invalidate signal high, the output of the OR gate 48 is forced high regardless of the output of the valid bit cell 44. As a result, the output of the NAND gate 52 is forced low, thereby turning the transistor 54 off such that the match line cannot be discharged during the invalidate process.

Figure 5:
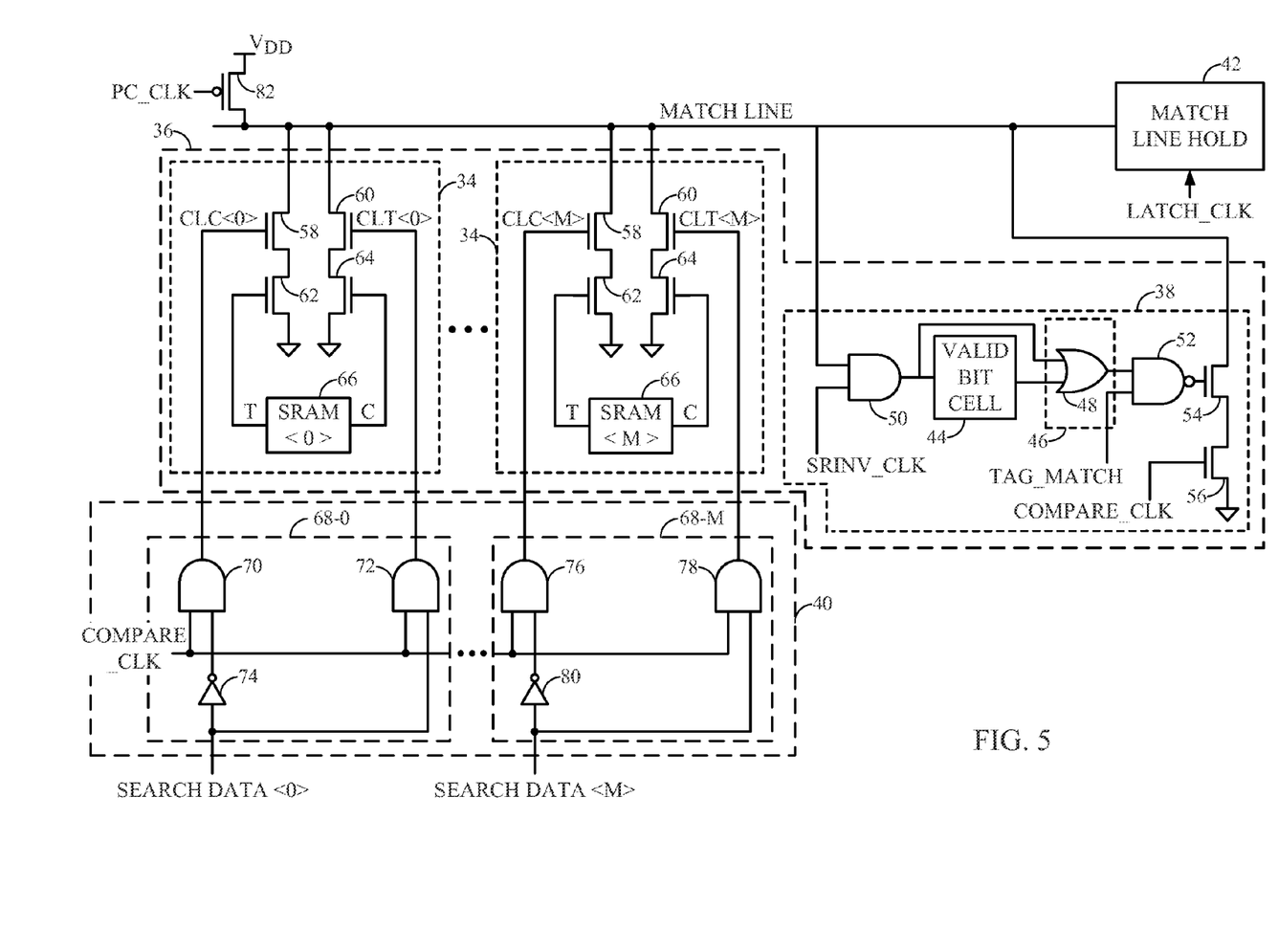
FIG. 5 is a more detailed illustration of a CAM cell array and corresponding valid bit circuitry that blocks an output of a valid bit cell from affecting a match line of the CAM cell array during an invalidate process of a search and invalidate operation according to one embodiment of the present disclosure.

FIG. 5 is a more detailed illustration of one of the CAM cell arrays 36 including the valid bit circuitry 38 of FIG. 4A as well as the search line driver circuitry 40 according to one embodiment of the present disclosure. As illustrated, in this embodiment, the CAM cells 34 in the CAM cell array 36 each include comparison circuitry comprised of transistors 58, 60, 62, and 64 connected as shown. Specifically, the transistors 58, 60, 62, and 64 are connected in an XNOR arrangement. In addition, the CAM cells 34 include corresponding Static Random Access Memory (SRAM) cells 66. In operation, the transistors 58, 60, 62, and 64 compare a bit stored by the SRAM cells 66 to a corresponding bit of the search data represented by the connected search lines (CLC, CLT). If there is not a match, then the transistors 58, 60, 62, and 64 discharge the match line to $V_{SS}$, which in this example is ground.

The search line driver circuitry 40 includes search line drivers 68-0 through 68-M for corresponding bits of the search data and digital words stored by the CAM cell arrays 36. In this embodiment, the search line driver 68-0 includes AND gates 70 and 72 and a NOT gate 74 connected as shown. In operation, when the comparison clock (COMPARE_CLK) is asserted, the AND gate 70 drives the search line CLC<0> to a value that is the complement of the $0^{th}$ bit of the search date (i.e., the complement of SEARCH DATA<0>). Similarly, the AND gate 72 drives the search line CLT<0> to a value corresponding to the $0^{th}$ bit of the search data (i.e., the true value of SEARCH DATA<0>). Likewise, the search line driver 68-M includes AND gates 76 and 78 and a NOT gate 80 connected as shown. In operation, when the comparison clock is asserted, the AND gate 76 drives the search line CLC<M> to a value that is the complement of the $M^{th}$ bit of the search date (i.e., the complement of SEARCH DATA<M>). Similarly, the AND gate 78 drives the search line CLT<M> to a value corresponding to the $M^{th}$ bit of the search data (i.e., the true value of SEARCH DATA<M>).

Lastly, transistor 82 enables pre-charging of the match line. Specifically, when a pre-charge clock signal (PC_CLK) is asserted low, the transistor 82 is turned on such that the match line is pre-charged to a high voltage level, which in this example is $V_{DD}$.

Figure 6:
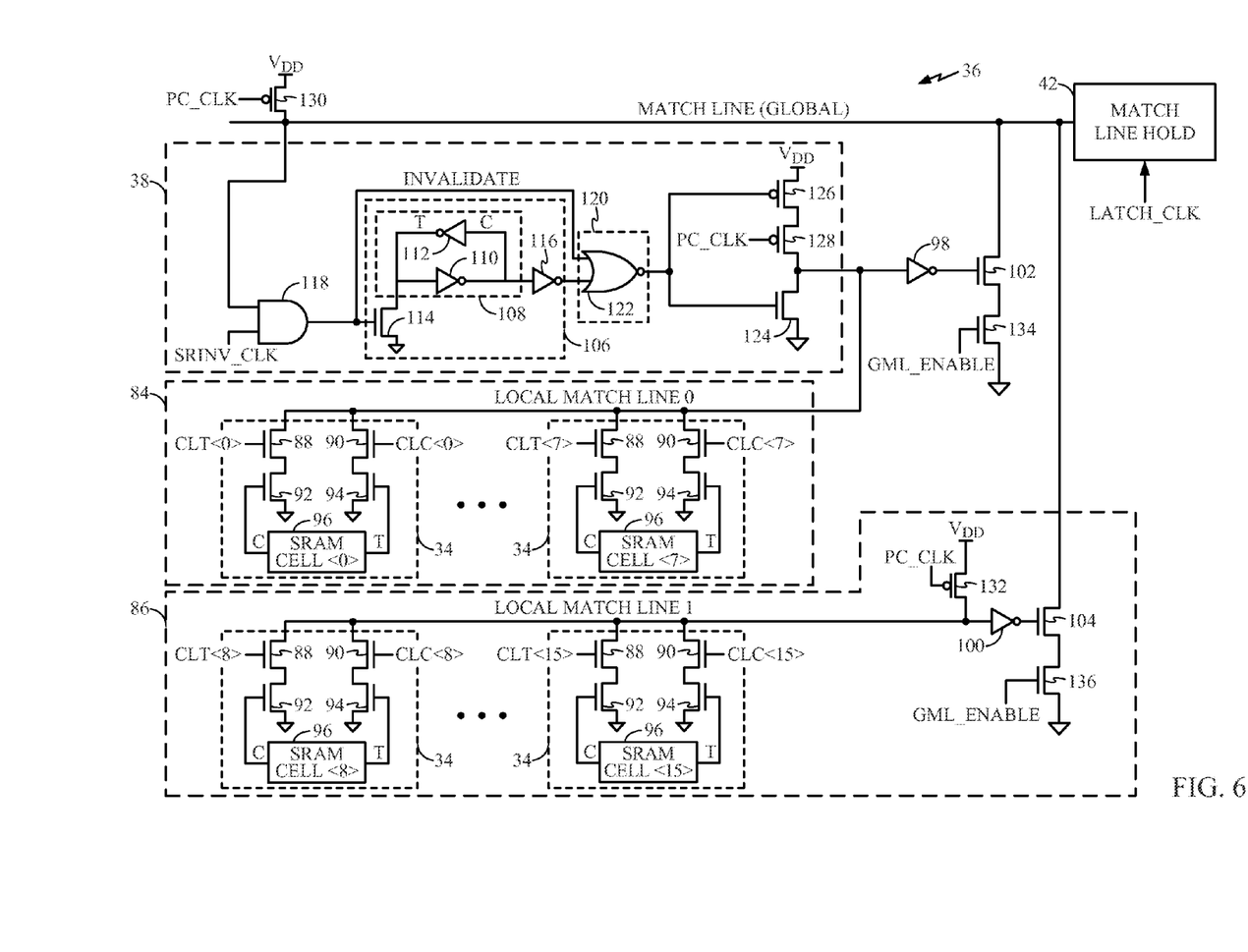
FIG. 6 is a more detailed illustration of a CAM cell array and corresponding valid bit circuitry that blocks an output of a valid bit cell from affecting a match line of the CAM cell array during an invalidate process of a search and invalidate operation according to another embodiment of the present disclosure.

FIG. 6 is a more detailed illustration of one of the CAM cell arrays 36 of FIG. 3 according to another embodiment of the present disclosure. The CAM cell array 36 includes a number of CAM cells 34 and valid bit circuitry 38. In this embodiment, the CAM cells 34 in the CAM cell array 36 are arranged into a number of sub-groups 84 and 86 having associated local match lines (LOCAL MATCH LINE 0 and LOCAL MATCH LINE 1). Note that while two sub-groups 84 and 86 are shown in this embodiment, the CAM cell array 36 may include two or more sub-groups depending on the desired number of CAM cells 34 per sub-group and the total number of bits in the digital word stored by the CAM cell array 36. As discussed above, each of the CAM cells 34 includes comparison circuitry formed by transistors 88, 90, 92, and 94 connected in an XNOR configuration and an SRAM cell 96 connected as shown. The local match lines are connected to the match line, or global match line, for the CAM cell array 36 via corresponding NOT gates 98 and 100 and transistors 102 and 104.

In this embodiment, the valid bit circuitry 38 includes a valid bit cell 106 including an SRAM cell 108 depicting a pair of cross-coupled inverters 110 and 112, a write transistor 114 that writes a "0" (i.e., an invalid bit) to the SRAM cell 108 when turned on, and a NOT gate 116 that inverts a complementary output (C) of the SRAM cell 108 to provide an output of the valid bit cell 106. The valid bit circuitry 38 also includes an AND gate 118 having a first input coupled to the global match line for the CAM cell array 36, a second input that receives the search-invalidate clock signal, and an output connected to a gate of the write transistor 114 and an input of blocking circuitry 120. The blocking circuitry 120 includes a NOR gate 122 having a first input coupled to an output of the valid bit cell 106, a second input coupled to an output of the AND gate 118, and an output coupled to gates of transistors 124 and 126. The transistors 121 and 126 are connected in series along with transistor 128 as shown.

Prior to a search-invalidate operation, during a low phase of the system clock (SYS_CLK), the global match line and the local match lines are pre-charged. In this example, the global and local match lines are pre-charged by asserting the pre-charge clock signal (PC_CLK) low to turn on transistors 128, 130, and 132. More specifically, the global match line of the CAM cell array 36 is pre-charged via the transistor 130, the local match line of the sub-group 84 is pre-charged via the transistors 126 and 128, and the local match line of the sub-group 86 is pre-charged via the transistor 132. Notably, with respect to the local match line of the sub-group 84, pre-charging is performed only if the valid bit cell 106 stores a "1" (i.e., is in the valid state). Otherwise, pre-charging of the match line for the sub-group 84 is not needed since the valid bit circuitry 38 will then discharge the match line because the valid bit cell 106 is in the invalid state.

After pre-charging, in order to perform a search-invalidate operation, a comparison process is triggered by the rising edge of the system clock (SYS_CLK). Notably, during the search-invalidate operation, discharging of the match line is enabled by asserting a global match line enable signal (GML_ENABLE), which in turn activates transistors 134 and 136. During the comparison process, the local match lines are discharged if any of the corresponding CAM cells 34 do not match the corresponding bits of the search data. Discharging of any one of the local match lines results in discharging of the global match line for the CAM cell array 36. For example, if the local match line of the sub-group 84 is discharged, the transistor 102 is turned on such that the global match line for the CAM cell array 36 is discharged to ground through the transistors 102 and 134.

After a defined amount of time has elapsed since the rising edge of the system clock (SYS_CLK), the search-invalidate clock signal (SRINV_CLK) is asserted high. If the global match line is also high as a result of a match, or hit, during the compare process, the AND gate 118 asserts its output high, i.e., asserts an invalidate signal high. In response, the NOR gate 122 blocks the output of the valid bit cell 106 while a "0" is written to the SRAM cell 108 of the valid bit cell 106 via the write transistor 114. Because of the blocking circuitry 120, and more specifically the NOR gate 122, the match indicator (i.e., the high voltage state) on the global match line is not disturbed by flipping the state of the valid bit cell 106.

Figure 7:
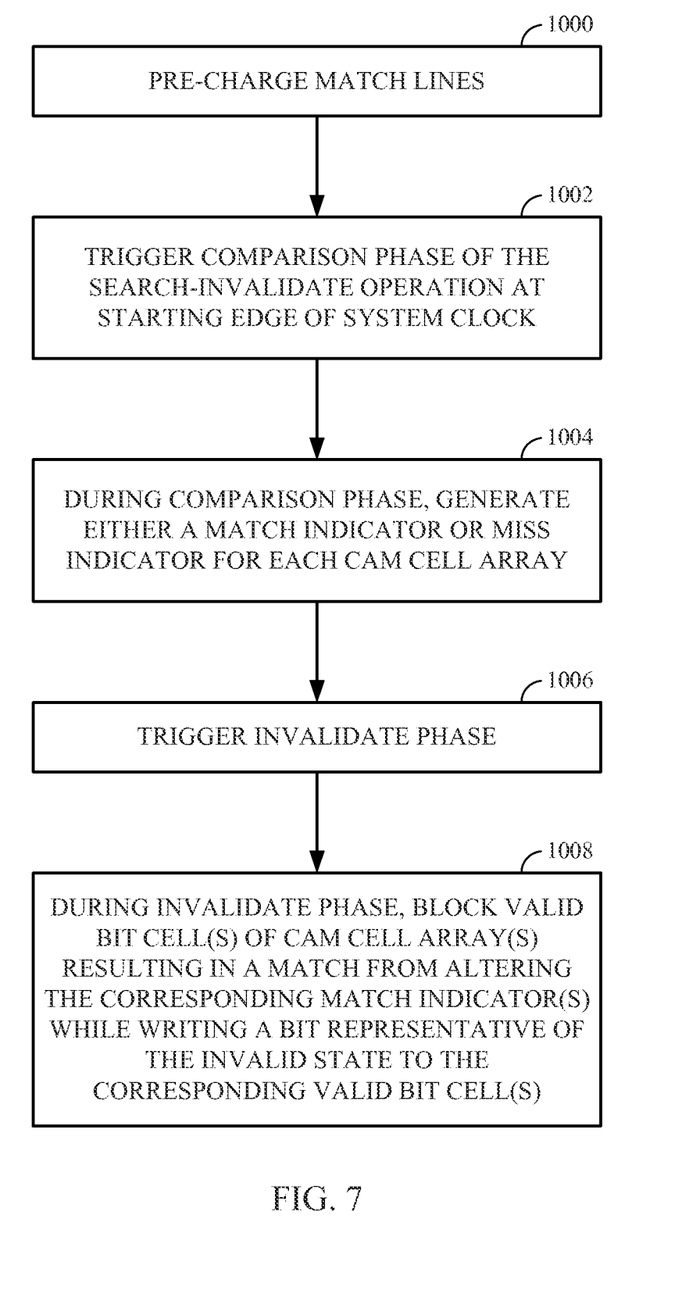
FIG. 7 is a flow chart illustrating a process for performing a search-invalidate operation according to one embodiment of the present disclosure.

FIG. 7 illustrates a process for performing a search-invalidate operation according to one embodiment of the present disclosure. Prior to performing the search-invalidate operation, during a low-phase of the system clock (SYS_CLK), the match lines are pre-charged (block 1000). More specifically, referring back to the embodiments of FIGS. 3, 5, and 6, the match lines are pre-charged by asserting the pre-charge clock (PC_CLK) low. After pre-charging, in order to perform the search-invalidate operation, a comparison process is triggered by the starting edge of the system clock (SYS_CLK) (block 1002). More specifically, the comparison process is triggered by asserting the comparison clock (COMPARE_CLK) at the starting edge of the system clock (SYS_CLK). The comparison clock defines a comparison phase for the search-invalidate operation.

During the comparison phase, each CAM cell array 36 generates either a match indicator on the corresponding match line that is indicative of a match (e.g., does not discharge the corresponding match line) or a miss indicator on the corresponding match that is indicative of a miss (e.g., discharges the corresponding match line) (block 1004). More specifically, referring back to the embodiment of FIGS. 5 and 6, each CAM cell array 36 discharges the corresponding match line if any one of the bits stored by the CAM cells 34 in the CAM cell array 36 does not match the corresponding bit of the search data, or if the corresponding valid bit cell 44 is in the invalid state. Otherwise, the match line remains charged to thereby serve as the match indicator that is indicative of a match for the CAM cell array 36. After a defined amount of time has elapsed since the rising edge of the system clock (SYS_CLK), the search-invalidate clock signal (SRINV_CLK) is asserted high, thereby triggering an invalidate phase of the search-invalidate operation (block 1006). In one embodiment, the search-invalidate clock signal (SRINV_CLK) is a phase-based clock signal that remains asserted until the ending edge of the system clock (SYS_CLK). During the invalidate phase, the blocking circuitry 46/120 for the CAM cell array(s) 36 resulting in a match operates to block an output of the corresponding valid bit cell(s) of the CAM cell array(s) 36 from altering the match indicator(s) while writing a bit representative of an invalid state to the corresponding valid bit cell(s) of the CAM cell array(s) 36 (block 1008). As discussed above, the manner in which the blocking occurs depends on the particular embodiment.

The embodiments of the CAM 32 disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 8:
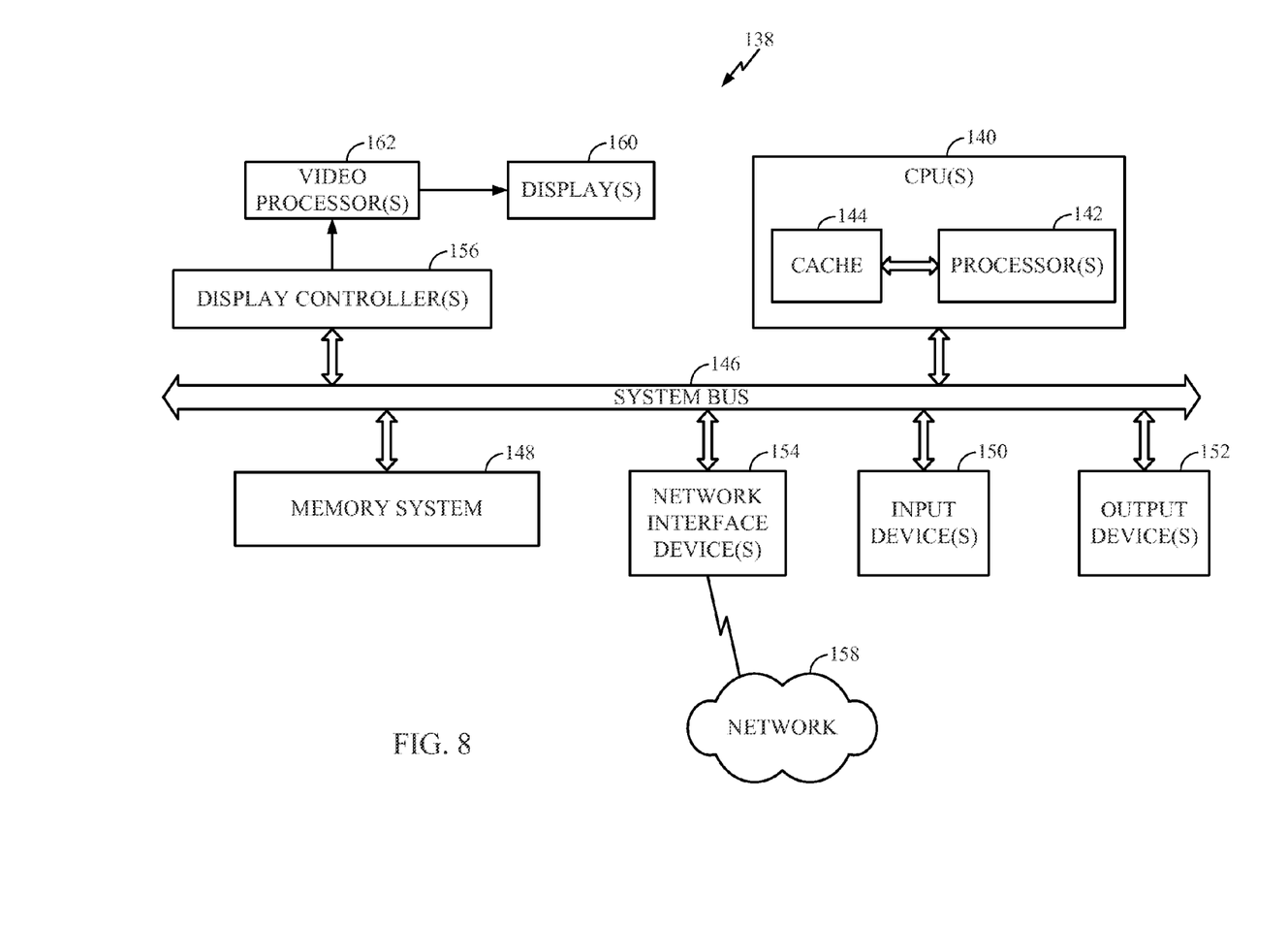
FIG. 8 is a block diagram of an exemplary processor-based system that can include the embodiments of the CAM disclosed herein.

In this regard, FIG. 8 illustrates an example of a processor-based system 138 that can employ the embodiments of the CAM 32 disclosed herein. In this example, the processor-based system 138 includes one or more central processing units (CPUs) 140, each including one or more processors 142. The CPU(s) 110 may have cache memory 144 coupled to the processor(s) 142 for rapid access to temporarily stored data. Notably, the CAM 32 may be implemented in the cache memory 144, but is not limited thereto. The CPU(s) 140 is coupled to a system bus 146. As is well known, the CPU(s) 140 communicates with other devices connected to the system bus 146 by exchanging address, control, and data information over the system bus 146. Although not illustrated in FIG. 8, multiple system buses 146 could be provided, wherein each system bus 116 constitutes a different fabric.

Other devices can be connected to the system bus 146. As illustrated in FIG. 7, these devices can include a memory system 148, one or more input devices 150, one or more output devices 152, one or more network interface devices 151, and one or more display controllers 156, as examples. The input device(s) 150 can include any type of input device, including but not limited to input keys, switches, voice processors, etc. The output device(s) 152 can include any type of output device, including but not limited to audio, video, other visual indicators, etc. The network interface device(s) 154 can be any devices configured to allow exchange of data to and from a network 158. The network 158 can be any type of network, including but not limited to a wired or wireless network, a private or public network, a local area network (LAN), a wide local area network (WLAN), and the Internet. The network interface device(s) 154 can be configured to support any type of communication protocol desired. The memory system 148 can include one or more memory units, which may include the CAM 32.

The CPU 140 may also be configured to access the display controller(s) 156 over the system bus 146 to control information sent to one or more displays 160. The display controller(s) 156 sends information to the display(s) 160 to be displayed via one or more video processors 162, which process the information to be displayed into a format suitable for the display(s) 160. The display(s) 160 can include any type of display, including but not limited to a cathode ray tube (CRT), a liquid crystal display (LCD), a plasma display, etc.

Those of skill in the art would further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The embodiments of the CAM 32 described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, a base station, or a server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A Content Addressable Memory (CAM) comprising:
a CAM cell array comprising a plurality of CAM cells and valid bit circuitry, where the valid bit circuitry is configured to perform an invalidate process for a search-invalidate operation in response to a phase-based clock signal.

2. The CAM of claim 1, wherein the search-invalidate operation is performed during a single active phase of a system clock signal, and the valid bit circuitry is configured to perform the invalidate process during a single active phase of the phase-based clock signal having a starting edge that is delayed with respect to a starting edge of the single active phase of the system clock signal and an ending edge aligned with an ending edge of the single active phase of the system clock signal.

3. The CAM of claim 2, wherein the valid bit circuitry comprises a valid bit cell and is further configured to, during a period between the starting and ending edges of the single active phase of the phase-based clock signal, write a bit to the valid bit cell that represents an invalid state.

4. The CAM of claim 3, wherein increasing a duration of the single active phase of the system clock signal increases an amount of time in which the invalidate process has to complete.

5. The CAM of claim 3, wherein the plurality of CAM cells are configured to perform a search operation during a period between the starting edge of the single active phase of the system clock signal and the starting edge of the single active phase of the phase-based clock signal.

6. The CAM of claim 5, wherein the plurality of CAM cells are configured to perform the search operation during an active phase of a second phase-based clock signal.

7. The CAM of claim 6, wherein the second phase-based clock signal has a starting edge that is aligned with the starting edge of the single active phase of the system clock signal and an ending edge that is aligned with the ending edge of the single active phase of the system clock signal.

8. The CAM of claim 5, further comprising match line hold circuitry for the CAM cell array that is configured to latch a match line indicator provided by the CAM cell array as a result of the search operation in response to a third phase-based clock signal.

9. The CAM of claim 8, wherein the match line hold circuitry is configured to latch the match line indicator during an active phase of the third phase-based clock signal having a starting edge that is delayed with respect to the starting edge of the single active phase of the system clock signal and an ending edge that is aligned with the ending edge of the single active phase of the system clock signal.

10. The CAM of claim 9, wherein the starting edge of the active phase of the third phase-based clock signal is aligned with the starting edge of the single active phase of the phase-based clock signal.

11. The CAM of claim 3, wherein the CAM cell array is configured to provide a match indicator during a search process of the search-invalidate operation, and the CAM further comprises block circuitry configured to block an output of the valid bit cell from altering the match indicator during the period between the starting and ending edges of the single active phase of the phase-based clock signal when the bit that represents the invalid state is written to the valid bit cell.

12. The CAM of claim 1, wherein the search-invalidate operation is performed over multiple active phases of a system clock signal, and the valid bit circuitry is configured to perform the invalidate process during a single active phase of the phase-based clock signal having a starting edge that is delayed with respect to a starting edge of a first active phase of the system clock signal and an ending edge that is aligned with an ending edge of a second or subsequent active phase of the system clock signal.

13. The CAM of claim 1 integrated in at least one semiconductor die.

14. The CAM of claim 1 integrated into a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

15. A method of operation of a Content Addressable Memory (CAM) that comprises a CAM cell array including a plurality of CAM cells and valid bit circuitry, comprising:
during a comparison phase of a search-invalidate operation, generating a match indicator that is indicative of a match for the CAM cell array in response to a digital word stored by the plurality of CAM cells in the CAM cell array matching an input digital word and a bit stored by a valid bit cell in the valid bit circuitry being representative of a valid state; and
during an invalidate phase of the search-invalidate operation, performing an invalidate process of the search-invalidate operation in response to a phase-based clock signal.

16. The method of claim 15, wherein the search-invalidate operation is performed during a single active phase of a system clock signal, and performing the invalidate process comprises performing the invalidate process during a single active phase of the phase-based clock signal having a starting edge that is delayed with respect to a starting edge of the single active phase of the system clock signal and an ending edge that is aligned with an ending edge of the single active phase of the system clock signal.

17. The method of claim 16, wherein performing the invalidate process during the single active phase of the phase-based clock signal comprises writing a bit to the valid bit cell that represents an invalid state during a period between the starting and ending edges of the single active phase of the phase-based clock signal.

18. A non-transitory computer-readable medium storing software for instructing a processor to:
effect a search-invalidate operation for a Content Addressable Memory (CAM) that comprises a CAM cell array including a plurality of CAM cells and valid bit circuitry comprising a valid bit cell by causing the CAM cell array to:
during a comparison phase of the search-invalidate operation, generate a match indicator that is indicative of a match for the CAM cell array in response to a digital word stored by the plurality of CAM cells in the CAM cell array matching an input digital word and a bit stored by the valid bit cell in the valid bit circuitry being representative of a valid state; and
during an invalidate phase of the search-invalidate operation, perform an invalidate process of the search-invalidate operation in response to a phase-based clock signal.

19. The non-transitory computer-readable medium of claim 18, wherein the search-invalidate operation is performed during a single active phase of a system clock signal, and the software for instructing the processor is further configured to cause the processor to perform the invalidate process during a single active phase of the phase-based clock signal having a starting edge that is delayed with respect to a starting edge of the single active phase of the system clock signal and an ending edge that is aligned with an ending edge of the single active phase of the system clock signal.

20. The non-transitory computer-readable medium of claim 19, wherein, in order to perform the invalidate process during the single active phase of the phase-based clock signal, the software for instructing the processor is further configured to cause the processor to write a bit to the valid bit cell that represents an invalid state during a period between the starting and ending edges of the single active phase of the phase-based clock signal.

21. A Content Addressable Memory (CAM) comprising:
a means for generating a match indicator, the means for generating comprising a plurality of CAM cells and valid bit circuitry comprising a valid bit cell; and
a means for performing an invalidate process of a search-invalidate operation in response to a phase-based clock signal.

22. The CAM of claim 21, wherein the search-invalidate operation is performed during a single active phase of a system clock signal, and the means for performing the invalidate process is configured to perform the invalidate process during a single active phase of the phase-based clock signal having a starting edge that is delayed with respect to a starting edge of the single active phase of the system clock signal and an ending edge that is aligned with an ending edge of the single active phase of the system clock signal.

23. The CAM of claim 22, wherein the means for performing the invalidate process is further configured to write a bit to the valid bit cell that represents an invalid state during a period between the starting and ending edges of the single active phase of the phase-based clock signal.

* * * * *